US008106806B2

(12) United States Patent
Toyomura et al.

(10) Patent No.: US 8,106,806 B2
(45) Date of Patent: Jan. 31, 2012

(54) AD CONVERTER

(75) Inventors: Junji Toyomura, Nagasaki (JP); Miho Inoue, Nagasaki (JP)

(73) Assignee: Sony Corporation, Tokyo (JP)

( * ) Notice: Subject to any disclaimer, the term of this patent is extended or adjusted under 35 U.S.C. 154(b) by 121 days.

(21) Appl. No.: 12/662,350

(22) Filed: Apr. 13, 2010

(65) Prior Publication Data
US 2010/0265115 A1 Oct. 21, 2010

(30) Foreign Application Priority Data

Apr. 20, 2009 (JP) ................................. 2009-101548

(51) Int. Cl.
*H03M 1/36* (2006.01)

(52) U.S. Cl. ....................................... 341/159; 341/155

(58) Field of Classification Search ........... 341/150–170
See application file for complete search history.

(56) References Cited

U.S. PATENT DOCUMENTS

| 5,157,397 | A  | * | 10/1992 | Vernon ........................ 341/159 |
| 7,053,690 | B2 | * | 5/2006  | Utsuno ........................ 327/407 |
| 7,265,602 | B2 | * | 9/2007  | Utsuno ........................ 327/407 |
| 7,649,486 | B2 | * | 1/2010  | Toyomura et al. ............ 341/159 |
| 7,696,916 | B2 | * | 4/2010  | Shimizu et al. ............... 341/159 |

FOREIGN PATENT DOCUMENTS

| JP | 2005-136696 | 5/2005 |
| JP | 3920162 | 2/2007 |

* cited by examiner

*Primary Examiner* — Lam T Mai
(74) *Attorney, Agent, or Firm* — Rader, Fishman & Grauer PLLC

(57) ABSTRACT

Disclosed herein is an AD converter, including, a reference voltage generator, a plurality of amplifiers, a plurality of averaging resistance elements, and a plurality of first averaging auxiliary circuits each including a first amplifier and a first resistance element.

8 Claims, 7 Drawing Sheets

AD CONVERTER

BACKGROUND OF THE INVENTION

1. Field of the Invention

This invention relates to an AD (analog to digital) converter, and more particularly to an AD converter which includes an averaging resistance element.

2. Description of the Related Art

Commonly, a flash type AD converter (hereinafter referred to simply as "AD converter") is widely known. While an AD converter of the type described includes a large number of amplifiers for amplifying reference voltages between an input analog signal and different reference voltages, if it is tried to implement a higher resolution, the offset between the amplifiers becomes serious, there is a tendency that the application ranges is limited.

Thus, an AD converter is known wherein an averaging resistance element is provided between outputs of those amplifiers to which reference voltages neighboring with each other are inputted to reduce the offset in order to solve the subject described.

For example, Japanese Patent Laid-Open No. 2005-136696 discloses such an AD converter as shown in FIG. 7. Referring to FIG. 7, the AD converter 100 shown includes a plurality of averaging resistance elements $R_{ave}$ provided in series between amplifiers 101-1 to 101-n of an amplifier group 101. In the AD converter 100, a plurality of, for example, nine, dummy circuits 102 are provided in series and terminated at an output terminal of the lowest-order amplifier 101-1 and an output terminal of the highest-order amplifier 101-n so that the offset between the amplifiers 101-1 and 101-n is reduced.

Further, the patent document mentioned above discloses also such a modified AD converter as shown in FIG. 8. Referring to FIG. 8, the AD converter 200 shown is configured such that the output terminals of the lowest- and highest-order amplifiers 101-1 and 101-n are terminated appropriately depending upon a relationship between the resistance value of output resistance (hereinafter referred to as "output resistance $R_1$") of the amplifiers and the resistance value of the averaging resistance devices $R_{ave}$. Also it is disclosed that, in the AD converter 200, suitable termination can be achieved where the resistance value of the output resistance $R_1$ of the amplifier 101 is $1.5R_{ave}-0.5R_1$ when it is higher than the resistance value of the averaging resistance device $R_{ave}$.

SUMMARY OF THE INVENTION

However, in the AD converter 100 disclosed in the above-specified patent document, it is necessary to provide a plurality of dummy circuits 102, and the overrange extent outside a full scale, which is a voltage range for comparison with the input analog signal, that is, VRT-VRB, expands. Therefore, it is difficult to apply the AD converter 100 so as to be suitable for operation in a lower voltage in nano-CMOS design in recent years.

Further, in the AD converter 200 disclosed in the patent document, since the threshold of the amplifier 101 is distorted from an ideal threshold when $R_1 > R_{ave}$, a plurality of, two, dummy circuits connected in series are required similarly as in the circuit shown in FIG. 7. Therefore, similarly to the AD converter 100, the overrange extent outside the full scale of the AD converter expands and it becomes difficult to apply the AD converter 200 so as to be suitable for operation in a lower voltage in nano-CMOS design in recent years.

Therefore, it is desirable to provide an AD converter of reduced power consumption and a reduced area which can minimize the overrange extent without being restricted by a relationship between the resistance value of output resistance of amplifiers and the resistance value of averaging resistance elements.

According to an embodiment of the present invention, there is provided an AD converter including a reference voltage generator adapted to divide a voltage difference between a first voltage and a second voltage to produce a plurality of reference voltages, a plurality of amplifiers adapted to amplify difference voltages between the reference voltages and a voltage of an input signal, a plurality of averaging resistance elements adapted to connect output terminals of the amplifiers to each other, and a plurality of first averaging auxiliary circuits each including a first amplifier for amplifying a difference voltage between a third voltage higher than the first voltage and the voltage of the input signal and a first resistance element for connecting an output terminal of that one of the amplifiers to which the first voltage is inputted as the reference voltage and an output terminal of the first amplifier.

Preferably, the AD converter further includes a plurality of first averaging auxiliary circuits each including a second amplifier for amplifying a difference voltage between a fourth voltage lower than the second voltage and the voltage of the input signal and a second resistance element for connecting an output terminal of that one of the amplifiers to which the second voltage is inputted as the reference voltage and an output terminal of the second amplifier.

In this instance, preferably the second resistance element has a resistance value set equal to a value obtained by subtracting a resistance value of output resistance of the second amplifier from a value obtained by multiplying a resistance value of the averaging resistance element by the number of the second averaging auxiliary circuits.

The first resistance element may have a resistance value set equal to a value obtained by subtracting a resistance value of output resistance of the first amplifier from a value obtained by multiplying a resistance value of the averaging resistance element by the number of the first averaging auxiliary circuits.

The AD converters described above includes, in addition to the reference voltage generator, plural amplifiers and plural averaging resistance elements, the plural first averaging auxiliary circuits. Consequently, an end portion of the AD converter can be terminated. Further, each of the first averaging auxiliary circuits includes the first amplifier for amplifying the difference voltage between the third voltage higher than the first voltage and the voltage of the input signal and the first resistance element for connecting the output terminal of that one of the amplifiers to which the first voltage is inputted as the reference voltage and the output terminal of the first amplifier. Consequently, by applying the third voltage to the first averaging auxiliary circuit, the end portion of the AD converter can be terminated, and consequently, the AD converter can operate at a reduced voltage and can be formed in a reduced area.

According to another embodiment of the present invention, there is provided an AD converter including a reference voltage generator adapted to divide a voltage difference between a first voltage and a second voltage to produce a plurality of reference voltages, a plurality of amplifiers adapted to amplify difference voltages between the reference voltages and a voltage of an input signal, a plurality of averaging resistance elements adapted to connect output terminals of the amplifiers to each other, and a plurality of second averaging auxiliary circuits each including a second amplifier for amplifying a difference voltage between a third voltage lower than the second voltage and the voltage of the input signal and a second resistance element for connecting an output terminal of that one of the amplifiers to which the second voltage is inputted as the reference voltage and an output terminal of the second amplifier.

Preferably, the AD converter further includes a plurality of first averaging auxiliary circuits each including a first amplifier for amplifying a difference voltage between a third voltage higher than the first voltage and the voltage of the input signal and a first resistance element for connecting an output terminal of that one of the amplifiers to which the first voltage is inputted as the reference voltage and an output terminal of the first amplifier.

In this instance, preferably the second resistance element has a resistance value set equal to a value obtained by subtracting a resistance value of output resistance of the second amplifier from a value obtained by multiplying a resistance value of the averaging resistance element by the number of the second averaging auxiliary circuits.

The first resistance element may have a resistance value set equal to a value obtained by subtracting a resistance value of output resistance of the first amplifier from a value obtained by multiplying a resistance value of the averaging resistance element by the number of the first averaging auxiliary circuits.

The AD converters described above includes, in addition to the reference voltage generator, plural amplifiers and plural averaging resistance elements, the plural second averaging auxiliary circuits. Consequently, an end portion of the AD converter can be terminated. Further, each of the second averaging auxiliary circuits includes the second amplifier for amplifying the difference voltage between the fourth voltage higher than the second voltage and the voltage of the input signal and the second resistance element for connecting the output terminal of that one of the amplifiers to which the second voltage is inputted as the reference voltage and the output terminal of the second amplifier. Consequently, by applying the fourth voltage to the second averaging auxiliary circuit, the end portion of the AD converter can be terminated, and consequently, the AD converter can operate at a reduced voltage and can be formed in a reduced area.

DETAILED DESCRIPTION OF THE PREFERRED EMBODIMENT

Figure 1:
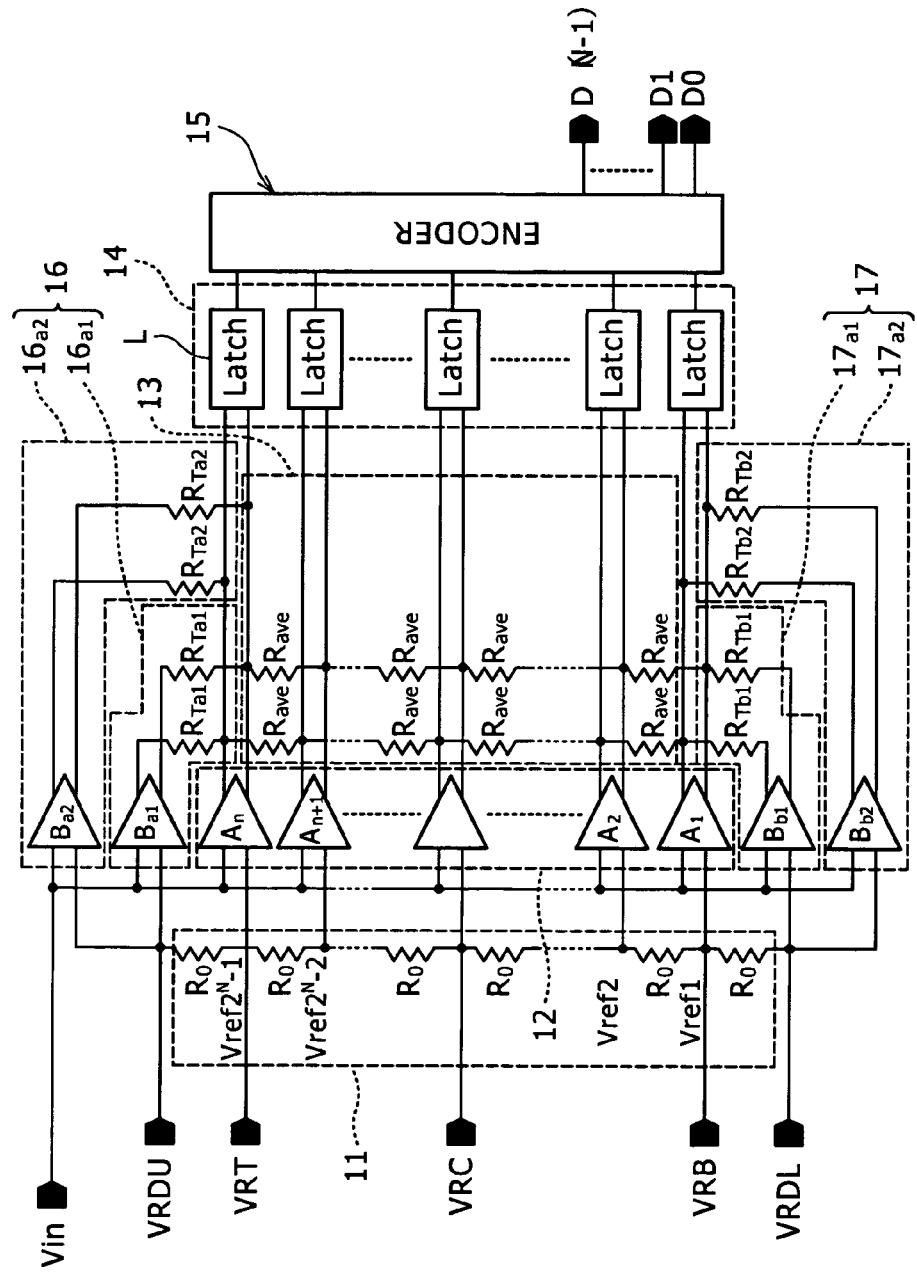
FIG. 1 is a block circuit diagram showing a general configuration of an AD converter to which the present invention is applied.

An AD converter according to the present embodiment is a flash type or parallel type AD converter for which an averaging resistance element is used and is an AD converter of reduced power consumption and a reduced area whose overrange extent is minimized.

The AD converter according to the present embodiment includes a reference voltage generator for dividing a voltage difference between a first voltage and a second voltage to produce a plurality of reference voltages, a plurality of amplifiers for amplifying difference voltages between the reference voltages and a voltage of an input signal, and a plurality of averaging resistance elements for connecting output terminals of the amplifiers.

The AD converter further includes a first averaging auxiliary circuit and a second averaging auxiliary circuit. The first averaging auxiliary circuit includes a first amplifier for amplifying a difference voltage between a third voltage higher than the first voltage and the voltage of the input signal and a first resistance element for connecting an output terminal of that one of the amplifiers to which the first voltage is inputted as the reference voltage and an output terminal of the first amplifier. Meanwhile, the second averaging auxiliary circuit includes a second amplifier for amplifying a difference voltage between a third voltage lower than the second voltage and the voltage of the input signal and a second resistance element for connecting an output terminal of that one of the amplifiers to which the second voltage is inputted as the reference voltage and an output terminal of the second amplifier.

The AD converter according to the present invention is characterized in that it includes a plurality of such first averaging auxiliary circuits and a plurality of such second averaging auxiliary circuits as described above. In other words, the averaging auxiliary circuits are provided not in series but in parallel as dummy circuits.

With the configuration described, it is possible to form the AD converter such that it is reduced in power consumption and area and can minimize the overrange extent without being restricted by a relationship between the resistance value of the output resistance of the amplifiers and the resistance value of the averaging resistance elements.

Further, if the resistance value of the first resistance element is set equal to a value obtained by subtracting a resistance value of the output resistance of the first amplifier from a value obtained by multiplying the resistance value of the averaging resistance element by the number of the first averaging auxiliary circuits, then the accuracy of the offset can be raised further. Similarly, if the resistance value of the second resistance element is set equal to a value obtained by subtracting a resistance value of the output resistance of the second amplifier from a value obtained by multiplying the resistance value of the averaging resistance element by the number of the second averaging auxiliary circuits, and the accuracy of the offset can be raised further.

It is to be noted that also it is possible to use only one of the first averaging auxiliary circuit and the second averaging auxiliary circuit while the remaining termination is carried out with the other circuit.

1. General Configuration of the AD Converter

In the following, the AD converter according to the present embodiment is described in detail with reference to the accompanying drawings.

The AD converter 1 according to the present embodiment converts an analog input signal into an N-bit digital output signal. Referring first to FIG. 1, the AD converter 1 shown includes a reference voltage generator 11, an amplifier group 12, an averaging circuit 13, a comparator group 14, an encoder 15, a first averaging auxiliary section 16 and a second averaging auxiliary section 17.

The reference voltage generator 11 is formed from a plurality of voltage dividing resistors (ladder resistors) $R_0$ connected in series and divides a voltage between a high potential side reference voltage VRT and a low potential side reference voltage VRB into $2^N-1$ voltages with an equal voltage Vr by means of the voltage dividing resistors $R_0$. By the voltage division, a plurality of different reference voltages Vref1 to Vref$2^N-1$ are produced. It is to be noted that the high potential side reference voltage VRT corresponds to an example of a first voltage and the low potential side reference voltage VRB corresponds to an example of a second voltage.

Figure 2:
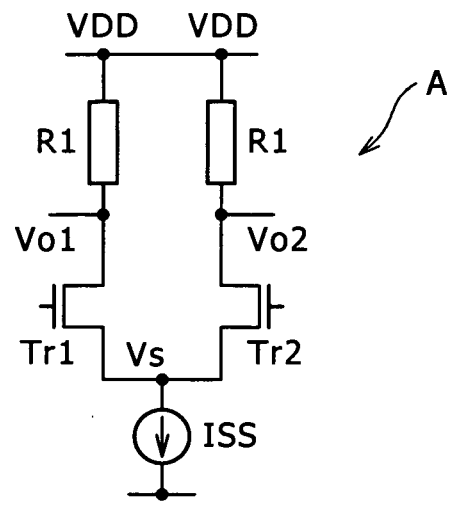
FIG. 2 is a circuit diagram showing a circuit configuration of an amplifier of the AD converter shown in FIG. 1.

The amplifier group 12 includes a plurality amplifiers A, that is, amplifiers $A_1$ to $A_n$. Each amplifier A is a differential amplifier and has such a configuration as shown in FIG. 2. Referring to FIG. 2, the amplifier A includes a differential pair including NMOS (Negative Metal Oxide Semiconductor) transistors Tr1 and Tr2, which are connected at the drain thereof to a power supply potential VDD each through an output resistor $R_1$. The NMOS transistors Tr1 and Tr2 are connected at the source thereof to a reference potential VSS through a common constant current source ISS. The drains of the NMOS transistors Tr1 and Tr2 serve as output terminals Vo1 and Vo2 of the amplifier A, and the gates of the NMOS transistors Tr1 and Tr2 serve as first and second input terminals, respectively.

Referring back to FIG. 1, a voltage Vin of the input signal is inputted to the first input terminal of each amplifier A, and a corresponding reference voltage Vref from among a plurality of reference voltages Vref, that is, Vref1 to Vref$2^N-1$, generated from the reference voltage generator 11 is inputted to the second input terminal of each amplifier A. Then, the amplifier A amplifies a difference voltage between the reference voltage Vref and the voltage Vin of the analog input signal and outputs the amplified difference voltage.

The averaging circuit 13 includes a plurality of averaging resistance elements $R_{ave}$ each of which connects those amplifiers A to which reference voltages Vref which neighbor with each other are inputted to reduce an offset between the amplifiers A.

The comparator group 14 includes a plurality of latch circuits L to which voltages outputted from the amplifiers $A_1$ to $A_n$ are inputted individually. The encoder 15 carries out encoding based on results of the comparison by the latch circuits L to produce and output N-bit digital signals D(0) to D(N−1) corresponding to the voltage Vin of the analog input signal.

Incidentally, referring to FIG. 2, if the voltage. Vin of the analog input signal having a magnitude equal to that of the high potential side reference voltage VRT is inputted to the amplifier A, then the gate voltage Vg of the NMOS transistor Tr2 rises and the source voltage Vs rises, and current flows through the NMOS transistor Tr2 and the output resistor $R_1$ and the voltage at the output terminal Vo2 drops. Therefore, an overrange, that is, a dummy range, is expanded with the AD converter, and the characteristic of the NMOS transistors Tr1 and Tr2 as input NMOS elements becomes likely to be crushed. Accordingly, a problem occurs that the amplifier A is disabled from operating as a linear amplifier.

Therefore, in the AD converter 1 according to the present embodiment, averaging auxiliary sections, that is, the first averaging auxiliary section 16 and the second averaging auxiliary section 17, are provided to minimize the overrange or dummy range to suppress that the amplifier A is disabled from operating as linear amplifiers.

Referring back to FIG. 1, each of the averaging auxiliary sections includes a plurality of averaging auxiliary circuits each formed from an amplifier B and a resistance element $R_T$ connected to an output terminal of the amplifier B.

In particular, the first averaging auxiliary section 16 terminates the high potential side of the amplifier group 12 and the averaging circuit 13 and includes a plurality of first averaging auxiliary circuits 16a each formed from a first amplifier $B_a$ and a first resistance element $R_{Ta}$ connected to an output terminal of the first amplifier $B_a$. In the AD converter 1 shown in FIG. 1, the first averaging auxiliary section 16 includes a first averaging auxiliary circuit $16_{a1}$ formed from a first amplifier $B_{a1}$ and a first resistance element $R_{Ta1}$ and another first averaging auxiliary circuit $16_{a2}$ formed from a first amplifier $B_{a2}$ and a first resistance element $R_{Ta2}$, and the two first averaging auxiliary circuits $16_{a1}$ and $16_{aa}$ are connected to the output terminal of the amplifier $A_n$ on the high potential side.

The first amplifiers $B_{a1}$ and $B_{a2}$ receive, at the first input terminal thereof, a voltage of the analog input signal and receive, at the second input terminal thereof, a high potential side dummy voltage VRDU. The first resistance elements $R_{Ta1}$ and $R_{Ta2}$ are connected at one end thereof to the output terminal of the first amplifiers $B_{a1}$ and $B_{a2}$ and connected at the other end thereof to the output terminal of the amplifier $A_n$. It is to be noted that the high potential side dummy voltage VRDU corresponds to an example of a third voltage. The high potential side dummy voltage VRDU is higher by the voltage Vr than the high potential side reference voltage VRT.

The second averaging auxiliary section 17 terminates the low potential side of the amplifier group 12 and the averaging circuit 13 and includes a plurality of second averaging auxiliary circuits $17_a$ each formed from a second amplifier $B_b$ and a second resistance element $R_{Tb}$ connected to an output terminal of the second amplifier $B_b$. The second averaging auxiliary section 17 in the present embodiment includes a second averaging auxiliary circuit $17_{a1}$ formed from a second amplifier $B_{b1}$ and a second resistance element $R_{Tb1}$ and another second averaging auxiliary circuit $17_{a2}$ formed from a second amplifier $B_{b2}$ and a second resistance element $R_{Tb2}$. The two second averaging auxiliary circuits $17_{a1}$ and $17_{a2}$ are connected to the output terminal of the amplifier $A_1$ on the low potential side.

The second amplifiers $B_{b1}$ and $B_{b2}$ receive a voltage of the analog input signal inputted to the first input terminal thereof and receive a low potential side dummy voltage VRDL inputted to the second input terminal thereof. The second resistance elements $R_{Tb1}$ and $R_{Tb2}$ are connected at one end thereof to an output terminal of the second amplifiers $B_{b1}$ and $B_{b2}$ and connected at the other end thereof to an output terminal of the amplifier $A_1$ on the low potential side. It is to be noted that the low potential side dummy voltage VRDL corresponds to an embodiment of a fourth voltage of the invention. The low potential side dummy voltage VRDL is lower by the voltage Vr than the low potential side reference voltage VRB.

In this manner, the voltage inputted to the first amplifiers $B_{a1}$ and $B_{a2}$ is the high potential side dummy voltage VRDU higher by the voltage Vr than the high potential side reference voltage VRT while the voltage inputted to the second amplifiers $B_{b1}$ and $B_{b2}$ is the low potential side dummy voltage VRDL lower by the voltage Vr than the low potential side reference voltage VRB. Accordingly, it is possible to suppress the overrange to its minimum.

Here, the amplifiers B, that is, the amplifiers $B_{a1}$, $B_{a2}$ and $B_{b1}$ and $B_{b2}$, are preferably formed in a same configuration as that of the amplifiers A. Particularly if the resistance value of the output resistors of the amplifiers B and the resistance value of the output resistors of the amplifiers A are set equal to each other and the resistance values of the resistance elements $R_{Ta1}$, $R_{Ta2}$ and $R_{Tb1}$, $R_{Tb2}$ are set equal to each other, then adjustment of the offset of the amplifiers A is facilitated.

In particular, the resistance values of the output resistors of the amplifiers B and the amplifiers A are set equal to each other and the resistance value of the first and second resistance elements $R_{Ta}$ and $R_{Tb}$ can be set to a value obtained by multiplying the resistance value of the averaging resistance elements $R_{ave}$ by 2 and subtracting the resistance value of the output resistor $R_1$ of the amplifiers A from the resulting resistance value, that is, to $R_T=2 \cdot R_{ave}-R_1$.

The reason why the offset of the amplifiers A can be reduced by achieving such termination as described above is described below with reference to FIGS. 5 and 6. The termination condition can be determined using the Kirchhoff's law.

Figure 3:
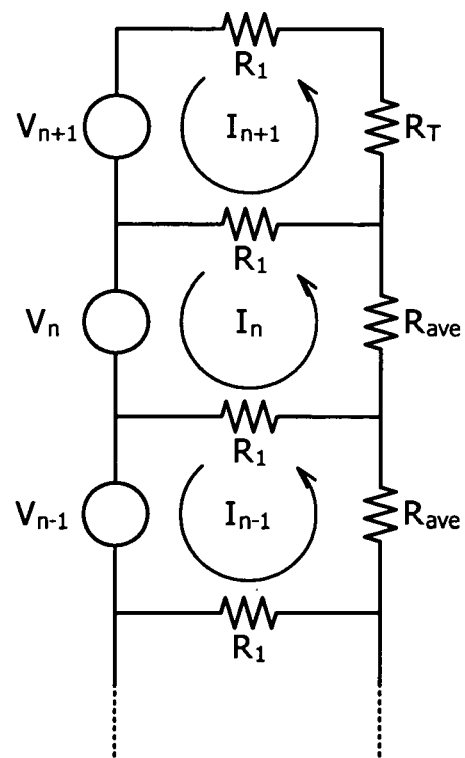
FIG. 3 is a circuit diagram showing a small signal equivalent circuit of a common AD converter.
Figure 8:
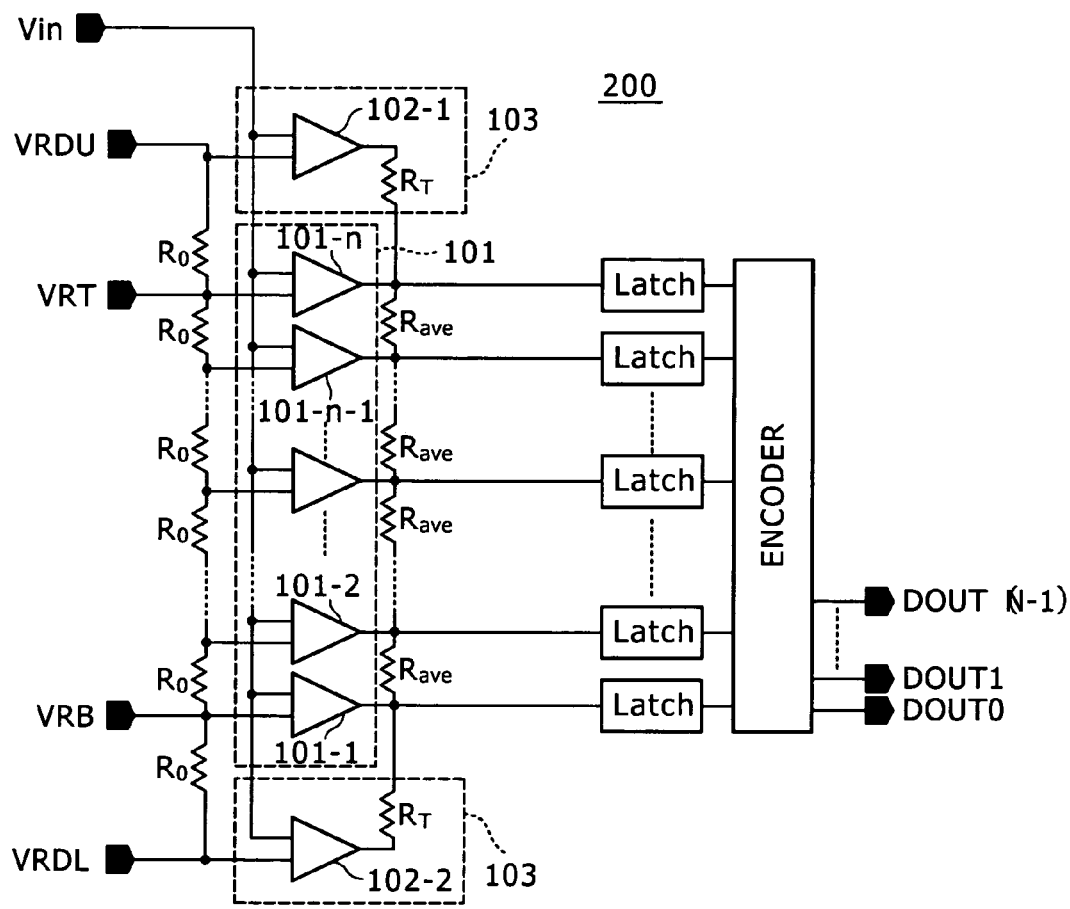
FIG. 8 is a similar view but showing a configuration of another common AD converter.

First, a termination condition of the circuit hitherto known shown in FIG. 8 is described with reference to FIG. 3. FIG. 3 is a small signal equivalent circuit of the circuit shown in FIG. 8 and shows part of a circuit configuration, that is, only the amplifiers 101-$n$-1, 101-$n$ and 102-2 and associated elements in order to facilitate illustration and description.

If a Kirchhoff's equation is set up with regard to $V_n$ and $V_{n+1}$ illustrated in FIG. 3, the following equalities are obtained:

$$V_n = R_1(I_n - I_{n-1}) + R_{ave} \times I_n + R_1(I_n - I_{n+1})$$
$$= R_1(2I_n - I_{n-1} - I_{n+1}) + R_{ave} \times I_n$$

$$V_{n+1} = R_1(I_{n+1} - I_n) + R_T \times I_{n+1} + R_1 \times I_{n+1}$$
$$= R_1(2I_{n+1} - I_n) + R_T \times I_{n+1}$$

From the above equalities, the following equality is obtained:

$$R_1(2I_n-I_{n-1}-I_{n+1})+R_{ave} \times I_n = R_1(2I_{n+1}-I_n)+R_T \times I_n$$

Here, if it is assumed that $I_{n-1}=I_n+I_{n+1}$, then $$R_T=R_{ave}-R_1>0$$

is obtained. In other words, $R_{ave}>R_1$ is obtained. Consequently, the termination condition that, where the averaging resistance element $R_{ave}$ is higher than the output resistor $R_1$, it is terminated is obtained.

Figure 4:
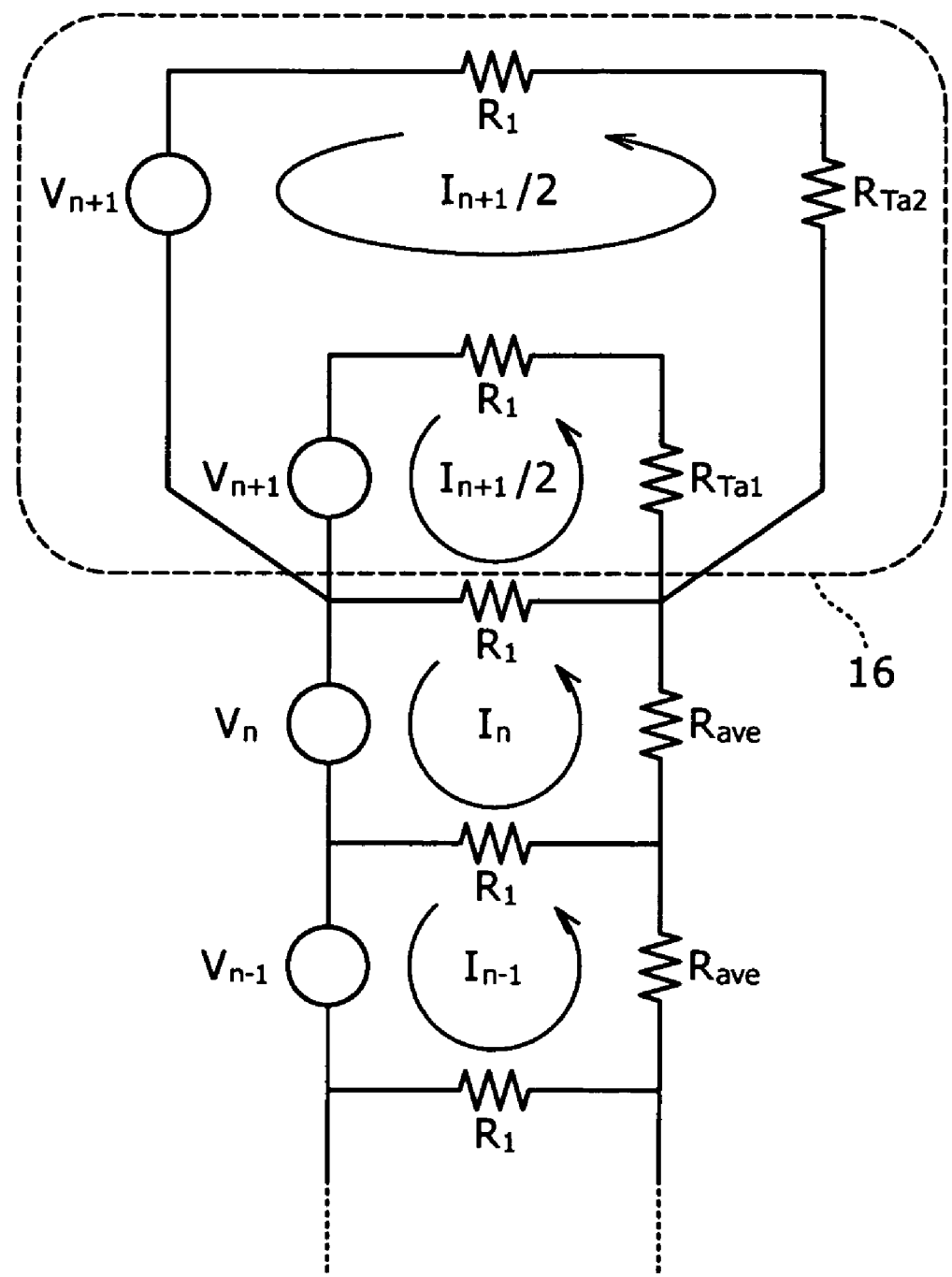
FIG. 4 is a circuit diagram showing a small signal equivalent circuit of the AD converter shown in FIG. 1.

Now, a termination condition of the AD converter 1 according to the present embodiment is described with reference to FIG. 4. FIG. 4 is a circuit diagram showing a small signal equivalent circuit of the AD converter shown in FIG. 1 which has two averaging auxiliary circuits and shows only part of the circuit configuration of the AD converter, that is, the amplifiers $A_n$ and $A_{n-1}$, first averaging auxiliary circuit 16 and associated elements, in order to facilitate description and illustration. Although the termination of the high potential side is described here, this similarly applies also to the low potential side. It is to be noted that the resistance value of the output resistors of the amplifiers B, that is, $B_{a1}$, $B_{a2}$ and $B_{b1}$, $B_{b1}$, and the resistance value of the output resistors of the amplifiers A are set equal to each other, and the resistance values of the resistance elements $R_{Ta1}$, $R_{Ta2}$ and $R_{Tb1}$, $R_{Tb2}$ are set to an equal value $R_T$.

If a Kirchhoff's equation is set up with regard to $V_{n+1}$ shown in FIG. 4, then $$V_{n+1}=R_1(I_{n+1}-I_n)+R_T \cdot I_{n+1}/2+R_1 \times I_{n+1}/2$$

Here, if it is assumed that $I_{n+1}=I_n$ and $V_{n+1}=R_{ave} \times I_{n+1}$, then $$2R_{ave}=R_1+R_T$$

is obtained. If this equation is solved with regard to the resistance element $R_T$, then $$R_T=2 \cdot R_{ave}-R_1$$

is obtained.

Therefore, a real resolution becomes $R_{ave}>\frac{1}{2} \times R_1$. Consequently, the resistance value of the averaging resistance element $R_{ave}$ can be reduced to one half from that of the AD converter hitherto known.

Figure 5:
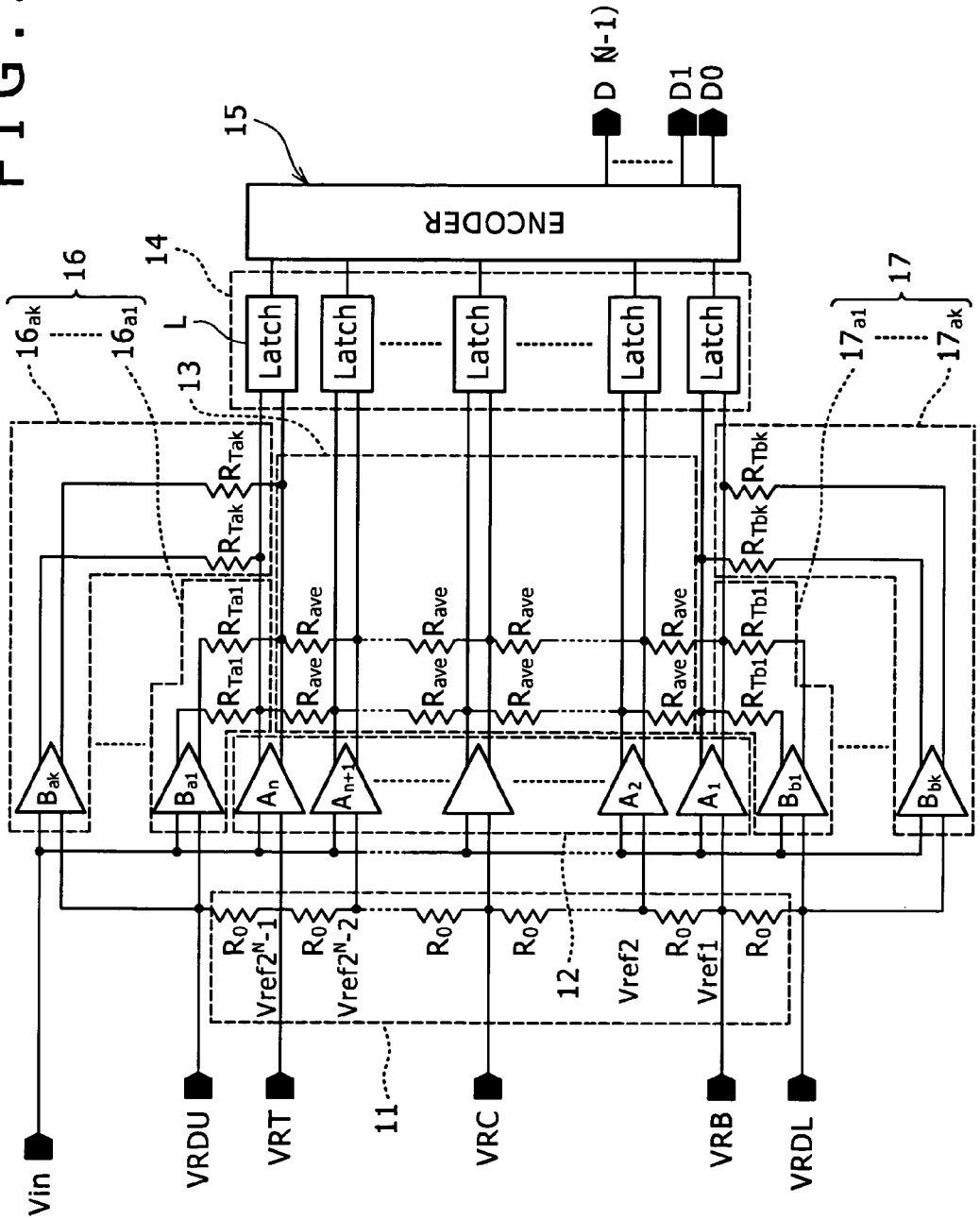
FIG. 5 is a block circuit diagram showing a general configuration of another AD converter to which the present invention is applied.

While, in the AD converter 1 shown in FIG. 1, two first averaging auxiliary circuits and two second averaging auxiliary circuits are provided, if k ($k \geq 3$) or more first and second averaging auxiliary circuits are provided as seen in FIG. 5, then the resistance value of the averaging resistance elements $R_{ave}$ can be further reduced.

Figure 6:
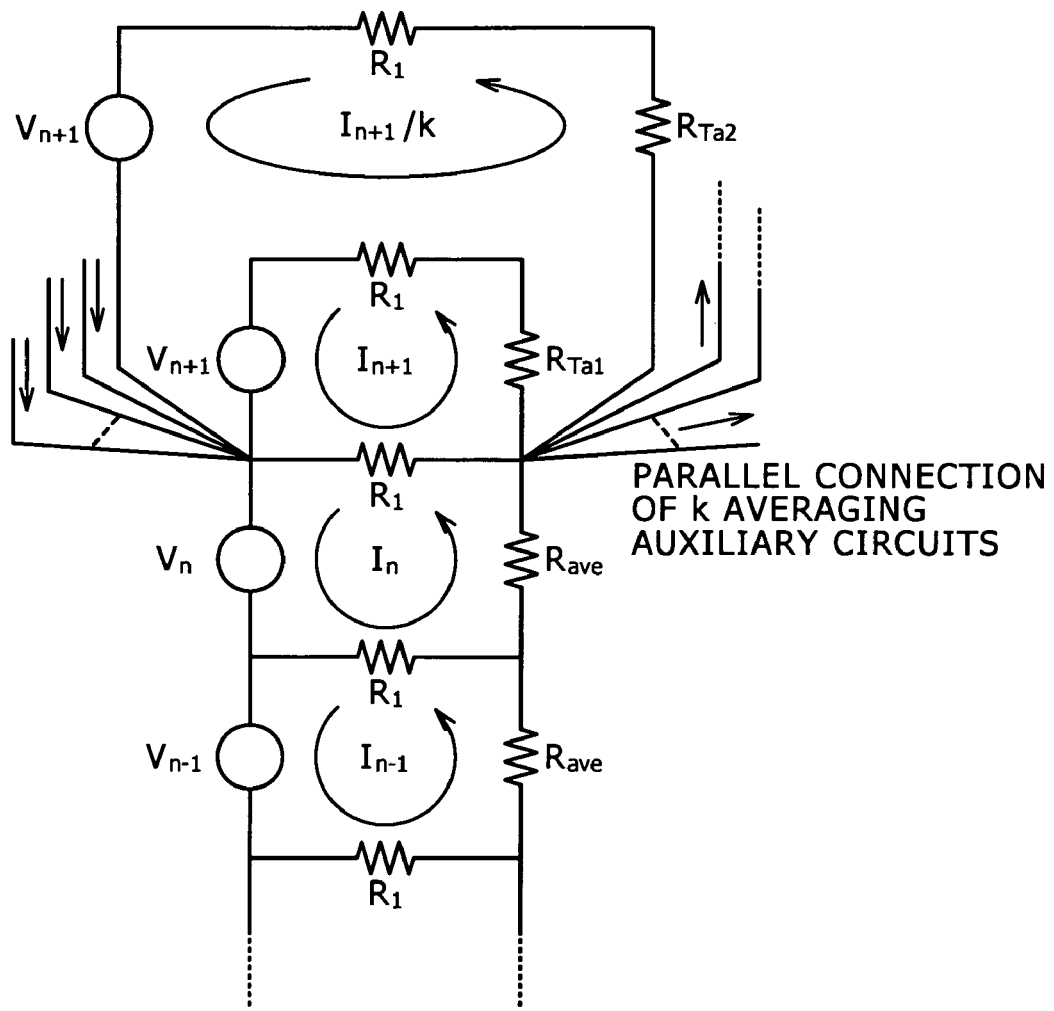
FIG. 6 is a circuit diagram showing a small signal equivalent circuit of the AD converter shown in FIG. 5.
Figure 7:
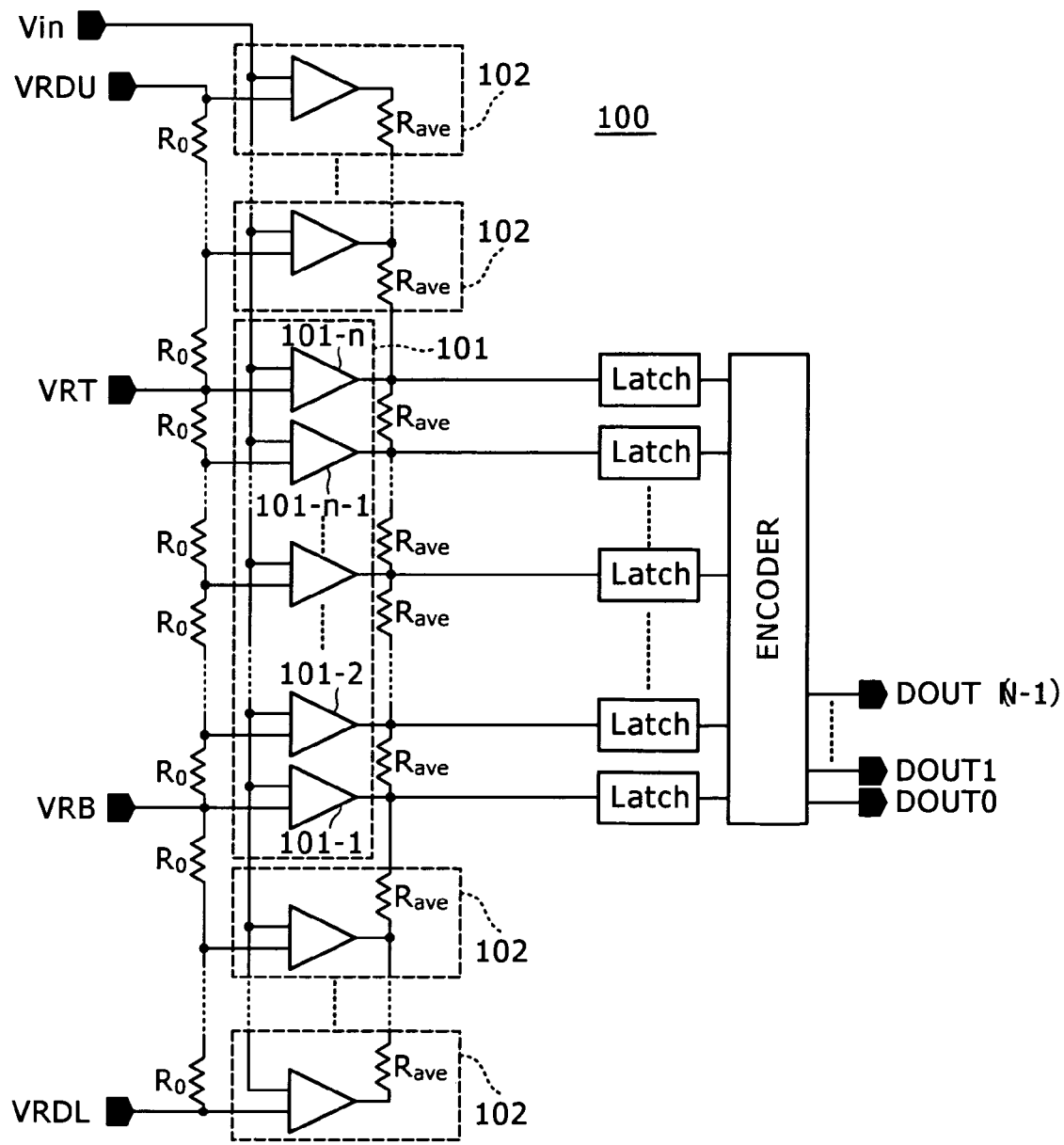
FIG. 7 is a block circuit diagram showing a configuration of a common AD converter.

FIG. 6 is a circuit diagram showing a small signal equivalent circuit of the AD converter shown in FIG. 5 which has k averaging auxiliary circuits and shows only part of the circuit configuration of the AD converter in order to facilitate description and illustration similarly to FIG. 4. Although the termination of the high potential side is described here, this similarly applies also to the low potential side. It is to be noted that the resistance value of the output resistors of the amplifiers B, that is, $B_{a1}$ to $B_{ak}$ and $B_{b1}$ to $B_{bk}$, and the resistance value of the output resistors of the amplifiers A are set equal to each other, and the resistance values of the resistance elements $R_{Ta1}$ to $R_{Tak}$ and $R_{Tb1}$ to $R_{Tbk}$ are set to an equal value $R_T$.

If a Kirchhoff's equation is set up with regard to $V_{n+1}$ shown in FIG. 4, then $$V_{n+1}=R_1(I_{n+1}-I_n)+(R_T \cdot I_{n+1}/k)+R_1 \times (I_{n+1}/k)$$

Here, if it is assumed that $I_{n+1}=I_n$ and $V_{n+1}=R_{ave} \times I_{n+1}$, then $$k \cdot R_{ave}=R_1+R_T$$

is obtained. If this equation is solved with regard to the resistance element $R_T$, then $$R_T=k \cdot R_{ave}-R_1$$

is obtained.

Therefore, a real resolution becomes $R_{ave}>1/k \times R_1$. Consequently, the resistance value of the averaging resistance element $R_{ave}$ can be reduced to one kth from that of the AD converter hitherto known.

In short, if the ratio between the resistance value of the averaging resistance elements $R_{ave}$ and the resistance value of the output resistors $R_1$:

$$R_{ave}:R_1=K:1 \ (K \leq 1)$$

is found, then termination can be achieved by an arbitrary number of averaging auxiliary circuits in an overrange of one range (equal voltage Vr) outside the full scale.

As described above, the AD converter 1 according to the present embodiment includes a reference voltage generator 11 for dividing the voltage difference between a high potential side reference voltage VRT and a low potential side reference voltage VRB to produce a plurality of reference voltages Vref (Vref1 to Vref$2^N-1$), a plurality of amplifiers A ($A_1$ to $A_n$) for amplifying potential differences between the reference voltages and the voltage Vin of an input signal, and a plurality of averaging resistance elements $R_{ave}$ for connecting output terminals of the amplifiers A to each other. The AD converter 1 further includes a plurality of first averaging auxiliary circuits $16_a$ having a first amplifier $B_a$ (Ba1, Ba2, ..., Bak) for amplifying a difference voltage between a high potential side dummy voltage VRDU, which is higher than the high potential side reference voltage VRT, and a first resistance element $R_{Ta}$ for connecting an output terminal of the amplifier $A_n$ to which the high potential side reference voltage VRT is inputted as a reference voltage from among the plural amplifiers A and an output terminal of the first amplifier $B_a$ to each other.

With the AD converter 1 having the configuration described above, since it includes the plural averaging resistance elements $R_{ave}$ which connect the output terminals of the plural amplifiers A to each other, the offset between the amplifiers A can be reduced. Further, since the AD converter 1 includes the first amplifier $B_a$ and the output terminal of the amplifier $A_n$ and the output terminal of the first amplifier $B_a$ are connected to each other through the first resistance element $R_{Ta}$, the output terminal of the amplifier $A_n$ can be terminated suitably.

Particularly since the plural first averaging auxiliary circuits $16_a$ are provided, that is, since the plural first averaging auxiliary circuits $16_a$ are formed in parallel to each other between the input terminal and the output terminal of the amplifier $A_n$, the overrange can be minimized without any increase. Consequently, the output terminal of the amplifier $A_n$ can be terminated suitably, and the high potential side dummy voltage VRDU can be suppressed from becoming high. Therefore, the AD converter 1 can be formed so as to operate at a reduced voltage. Also it is possible to further reduce the area of the AD converter 1.

The AD converter 1 further includes a plurality of second averaging auxiliary circuits $17_a$ ($17_{a1}$, $17_{a2}$, ..., $17_{ak}$) each having a second amplifier $B_b$ ($B_{b1}$, $B_{b2}$, ..., $B_{bk}$) for amplifying a potential difference between the low potential side dummy voltage VRDL, which is lower than the low potential side reference voltage VRB, and the voltage Vin of the input signal and a second resistance element $R_{Tb}$ ($R_{Tb1}$, $R_{Tb2}$, ..., $R_{Tbk}$) for connecting an output terminal of the amplifier $A_1$ to which the low potential side reference voltage VRB is inputted as a reference voltage from among the plural amplifiers A and the output of the second amplifier $B_b$ to each other.

In this manner, since the AD converter 1 includes the second amplifier $B_b$ and the output terminal of the amplifier $A_1$ and the output terminal of the second amplifier $B_b$ are connected to each other through the second resistance element $R_{Tb}$, the output terminal of the amplifier $A_1$ can be terminated appropriately.

Since particularly the plural second averaging auxiliary circuits $17_a$ are provided similarly to the first averaging auxiliary circuits $16_a$ described hereinabove, that is, since the plural second averaging auxiliary circuits $17_a$ are formed in parallel to each other between the input terminal and the output terminal of the amplifier $A_1$, the overrange can be minimized without any increase. Consequently, the output terminal of the amplifier $A_1$ can be terminated suitably and the low potential side dummy voltage VRDL can be suppressed from becoming lower. Therefore, the difference voltage between the high potential side dummy voltage VRDU and the low potential side dummy voltage VRDL can be suppressed from becoming small. Accordingly, the AD converter 1 can be formed so as to operate at a lower voltage, and the area of the AD converter 1 can be further reduced.

Further, where the resistance values of the output resistors of the first amplifier $B_a$ and the second amplifier $B_b$ and the resistance value of the output resistor of the amplifiers A are set to an equal value and the resistance values of the resistance elements $R_{Ta1}$, $R_{Ta2}$ and $R_{Tb1}$, $R_{Tb2}$ are set to an equal value, adjustment of the offset of the amplifiers A can be carried out readily.

In particular, in the AD converter 1, the resistance value of the first resistance element $R_{Ta}$ can be made a value obtained by subtracting the resistance value of the output resistor $R_1$ of the first amplifier $B_a$ from a value obtained by multiplying the resistance value of the averaging resistance elements $R_{ave}$ by the number of first averaging auxiliary circuits $16_a$. Consequently, the resistance value of the averaging resistance elements $R_{ave}$ can be reduced in response to the number of first averaging auxiliary circuits $16_a$.

Further, in the AD converter 1, the resistance value of the second resistance element $R_{Tb}$ may be equal to a value obtained by subtracting the resistance value of the output resistor of the second amplifier $B_b$ from a value obtained by multiplying the resistance value of the averaging resistance elements $R_{ave}$ by the number of second averaging auxiliary circuits $17_a$. Consequently, the resistance value of the averaging resistance elements $R_{ave}$ can be reduced in response to the number of second averaging auxiliary circuits $17_a$.

While several preferred embodiments of the present invention have been described in detail with reference to the accompanying drawings, they are illustrative, and the present invention can be carried out in various altered or modified forms based on the knowledge of those skilled in the art.

Further, while, in the embodiment described above, difference amplifiers A are used, the amplifiers are not limited to this, but a single end amplifier may be used instead.

The present application contains subject matter related to that disclosed in Japanese Priority Patent Application JP 2009-101548 filed in the Japan Patent Office on Apr. 20, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog to digital converter, comprising:
a reference voltage generator adapted to divide a voltage difference between a first voltage and a second voltage to produce a plurality of reference voltages;
a plurality of amplifiers adapted to amplify difference voltages between the reference voltages and a voltage of an input signal;
a plurality of averaging resistance elements adapted to connect output terminals of said amplifiers to each other; and
a plurality of first averaging auxiliary circuits each including a first amplifier for amplifying a difference voltage between a third voltage higher than the first voltage and the voltage of the input signal and a first resistance element for connecting an output terminal of that one of said amplifiers to which the first voltage is inputted as the reference voltage and an output terminal of said first amplifier.

2. The analog to digital converter according to claim 1, further comprising a plurality of first averaging auxiliary circuits each including a second amplifier for amplifying a difference voltage between a fourth voltage lower than the second voltage and the voltage of the input signal and a second resistance element for connecting an output terminal of that one of said amplifiers to which the second voltage is inputted as the reference voltage and an output terminal of said second amplifier.

3. The analog to digital converter according to claim 2, wherein said second resistance element has a resistance value set equal to a value obtained by subtracting a resistance value of output resistance of said second amplifier from a value obtained by multiplying a resistance value of said averaging resistance element by the number of the second averaging auxiliary circuits.

4. The analog to digital converter according to claim 1, wherein said first resistance element has a resistance value set equal to a value obtained by subtracting a resistance value of output resistance of said first amplifier from a value obtained by multiplying a resistance value of said averaging resistance element by the number of the first averaging auxiliary circuits.

5. An analog to digital converter, comprising:
- a reference voltage generator adapted to divide a voltage difference between a first voltage and a second voltage to produce a plurality of reference voltages;
- a plurality of amplifiers adapted to amplify difference voltages between the reference voltages and a voltage of an input signal;
- a plurality of averaging resistance elements adapted to connect output terminals of said amplifiers to each other; and
- a plurality of second averaging auxiliary circuits each including a second amplifier for amplifying a difference voltage between a third voltage lower than the second voltage and the voltage of the input signal and a second resistance element for connecting an output terminal of that one of said amplifiers to which the second voltage is inputted as the reference voltage and an output terminal of said second amplifier.

6. The analog to digital converter according to claim 5, further comprising a plurality of first averaging auxiliary circuits each including a first amplifier for amplifying a difference voltage between a third voltage higher than the first voltage and the voltage of the input signal and a first resistance element for connecting an output terminal of that one of said amplifiers to which the first voltage is inputted as the reference voltage and an output terminal of said first amplifier.

7. The analog to digital converter according to claim 6, wherein said first resistance element has a resistance value set equal to a value obtained by subtracting a resistance value of output resistance of said first amplifier from a value obtained by multiplying a resistance value of said averaging resistance element by the number of the first averaging auxiliary circuits.

8. The analog to digital converter according to claim 5, wherein said second resistance element has a resistance value set equal to a value obtained by subtracting a resistance value of output resistance of said second amplifier from a value obtained by multiplying a resistance value of said averaging resistance element by the number of the second averaging auxiliary circuits.

* * * * *